US012813286B2

(12) United States Patent
Ma

(10) Patent No.: US 12,813,286 B2
(45) Date of Patent: Nov. 24, 2026

(54) POWER SEMICONDUCTOR MODULE AND METHOD OF PRODUCING A POWER SEMICONDUCTOR MODULE

(71) Applicant: Infineon Technologies AG, Neubiberg (DE)

(72) Inventor: Kwok-Wai Ma, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 1038 days.

(21) Appl. No.: 17/992,185

(22) Filed: Nov. 22, 2022

(65) Prior Publication Data

US 2024/0170418 A1 May 23, 2024

(51) Int. Cl.
*H10W 44/00* (2026.01)
*H10W 40/25* (2026.01)
(Continued)

(52) U.S. Cl.
CPC ....... *H10W 44/601* (2026.01); *H10W 40/255* (2026.01); *H10W 70/611* (2026.01); *H10W 70/685* (2026.01); *H10W 90/00* (2026.01)

(58) Field of Classification Search
CPC . H10W 44/601; H10W 70/685; H10W 90/00; H10W 40/255; H10W 70/611
See application file for complete search history.

(56) References Cited

U.S. PATENT DOCUMENTS

2004/0228094 A1* 11/2004 Ahmed ................. H02M 7/003 257/E23.114
2013/0075932 A1 3/2013 Schwarzer et al.
(Continued)

FOREIGN PATENT DOCUMENTS

CN 114664758 A 6/2022

OTHER PUBLICATIONS

Wintrich, Arendt, et al., “Semikron Innovation + Service Application Manual Power Semiconductors”, Semikron International GmbH, 2nd revised edition, Nov. 2010, pp. 1-452.
(Continued)

*Primary Examiner* — Jacob Y Choi
*Assistant Examiner* — Neil R Prasad
(74) *Attorney, Agent, or Firm* — Murphy, Bilak & Homiller, PLLC

(57) ABSTRACT

A power semiconductor module includes: a substrate having an electrically insulative material, a first metallization layer at a frontside of the electrically insulative material, and a second metallization layer at a backside of the electrically insulative material; a first power semiconductor die of a power electronics circuit; an opening in the electrically insulative material that exposes part of the second metallization layer from the electrically insulative material; and an electrical conductor disposed in the opening and connected to the part of the second metallization layer exposed by the opening. The first power semiconductor die is attached to the first metallization layer at the frontside of the electrically insulative material, or is embedded in the electrically insulative material. The electrical conductor enables a point of electrical contact for the second metallization layer at the frontside of the electrically insulative material. Additional power semiconductor modules and methods of production are described.

23 Claims, 10 Drawing Sheets

(51) Int. Cl.

| | |
|---|---|
| ***H10W 70/60*** | (2026.01) |
| ***H10W 70/685*** | (2026.01) |
| ***H10W 90/00*** | (2026.01) |

(56) References Cited

U.S. PATENT DOCUMENTS

| | | | | |
|---|---|---|---|---|
| 2018/0123476 | A1* | 5/2018 | Schutten | H05K 3/36 |
| 2018/0366423 | A1* | 12/2018 | Ong | H10W 44/501 |
| 2023/0197668 | A1* | 6/2023 | Tamada | H10W 90/00<br>363/131 |
| 2025/0294680 | A1* | 9/2025 | Perrin | H05K 1/141 |

OTHER PUBLICATIONS

Robutel, Remi, et al., "Design and Implementation of Integrated Common Mode Capacitors for SiC-JFET Inverters", IEEE Transactions on Power Electronics, vol. 29, No. 7, Jul. 2014, pp. 3625-3636.

* cited by examiner

100

100

100

100

POWER SEMICONDUCTOR MODULE AND METHOD OF PRODUCING A POWER SEMICONDUCTOR MODULE

BACKGROUND

Power semiconductor devices used in power electronics applications typically switch at high voltage, high frequency, and high speed. Such power semiconductor devices are typically mounted on a heat sink with an electrical isolation layer inserted between the heat sink and power semiconductor devices. While many different forms of packaging, mounting and isolation are commonly used, the electrical isolation layer should be thin with good thermal conductivity to ensure adequate heat transfer from the power semiconductor devices to the heat sink. When power semiconductor devices are mounted on a heat sink with an electrical isolation layer in between, a capacitor is effectively formed, with each power semiconductor device acting as one terminal of the capacitor and the heat sink as the other terminal. The thin electrical isolation layer between the power semiconductor devices and the heat sink acts as the capacitor dielectric. This capacitor is often referred to as a coupling or stray capacitor in noise analysis.

The coupling/stray capacitor forms a path capacitively coupled between the switching voltage waveform of the power semiconductor switching devices and the heat sink. Since the heat sink is often directly grounded by a wire or indirectly grounded by a capacitor, the following complete signal path is formed: from the AC power inputs to the power conversion stage, then from the power semiconductor switching devices to the heat sink, then from the heat sink to ground, and finally back to the AC input ground. This signal path causes common-mode noise from power semiconductor switching devices to flow to the AC ground and leads to common-mode (CM) electromagnetic interference (EMI). There are different ways to mitigate the CM-EMI problem.

For example, a common-mode filter that includes a common-mode inductor and a common-mode capacitor, also known as a Y-capacitor, can be inserted between the AC source and the power conversion stage, to provide a high-impedance path for noise to reach the AC source and a low-impedance bypass path between the AC input and the AC ground. The CM-noise suppression effectiveness of such a common-mode filter depends on, among other things, the impedance of the Y-capacitor compared to the noise source impedance at the frequency range of concern. Since international electromagnetic compatibility (EMC) standards on conducted and radiated emission cover frequencies up to 30 MHz and 1 GHz, respectively, the high-frequency impedance of the Y-capacitor, particularly due to the internal equivalent series inductance (ESL) and external interconnection stray inductance, are an important concern.

Y-capacitors have been connected between the power source of a DC link and AC ground directly around the power semiconductor devices and heat sink to reduce the interconnection stray inductance. However, due to the lack of a proper connection point to the heat sink, the performance of such a Y-capacitor connection approach is often suboptimal.

Hence, there is a need for an improved Y-capacitor connection approach for power semiconductor devices used in power electronics applications and that are capacitively coupled to a heat sink.

SUMMARY

According to an embodiment of a power semiconductor module, the power semiconductor module comprises: a substrate comprising an electrically insulative material, a first metallization layer at a frontside of the electrically insulative material, and a second metallization layer at a backside of the electrically insulative material; a first power semiconductor die of a power electronics circuit; an opening in the electrically insulative material that exposes part of the second metallization layer from the electrically insulative material; and an electrical conductor disposed in the opening and connected to the part of the second metallization layer exposed by the opening, wherein the first power semiconductor die is attached to the first metallization layer at the frontside of the electrically insulative material, or is embedded in the electrically insulative material, wherein the electrical conductor enables a point of electrical contact for the second metallization layer at the frontside of the electrically insulative material.

According to another embodiment of a power semiconductor module, the power semiconductor module comprises: a substrate comprising an electrically insulative material, a first metallization layer at a frontside of the electrically insulative material, and a second metallization layer at a backside of the electrically insulative material; a first power semiconductor die of a half bridge; a second power semiconductor die of the half bridge; an opening in the electrically insulative material that exposes part of the second metallization layer from the electrically insulative material; and an electrical conductor disposed in the opening and connected to the part of the second metallization layer exposed by the opening, wherein the electrical conductor comprises an electrically conductive via that extends through the electrically insulative material and connects the part of the second metallization layer exposed by the opening to a first island of the first metallization layer, wherein the first power semiconductor die is attached to a second island of the first metallization layer that forms a positive DC terminal for the half bridge, wherein a third island of the first metallization layer forms a negative DC terminal for the half bridge, wherein the second power semiconductor die is attached to a fourth island of the first metallization layer that forms the AC terminal for the half bridge.

According to an embodiment of a method of producing a power semiconductor module, the method comprises: providing a substrate comprising an electrically insulative material, a first metallization layer at a frontside of the electrically insulative material, and a second metallization layer at a backside of the electrically insulative material; attaching a first power semiconductor die of a power electronics circuit to the first metallization layer at the frontside of the electrically insulative material, or embedding the first power semiconductor die in the electrically insulative material; forming an opening in the electrically insulative material that exposes part of the second metallization layer from the electrically insulative material; and forming an electrical conductor in the opening and that is connected to the part of the second metallization layer exposed by the opening, the electrical conductor enabling a point of electrical contact for the second metallization layer at the frontside of the electrically insulative material.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description that follows.

DETAILED DESCRIPTION

The embodiments described herein provide an approach for connecting a Y-capacitor to ground and which reduces the interconnection stray inductance of the Y-capacitor, yielding lower impedance at high frequencies, e.g., in the 30 MHz to 1 GHz or higher range and providing improved CM-EMI suppression from the noise source of switch devices included in a power semiconductor module. The switch devices included in the power semiconductor module may be integrated in the same die (chip) or provided as packaged discrete components. In either case, the Y-capacitor connection approach described herein may be used with various types of (carrier) substrates for the switch devices, such as direct bond copper (DBC) substrates, active metal brazed (AMB) substrates, insulated metal (IMS) substrates, etc.

For example, in the case of a DBC or AMB substrate, an electrically conductive via is formed in the base ceramic material for connection between the bottom (ground plane) side of the substrate and the top (circuit) side to which the switch devices are attached. In the case of an IMS substrate, an opening is formed in the dielectric layer of the substrate for connecting the baseplate/ground plane with the circuit layer of the substrate.

With the substrate-based ground connection provided, one or more Y-capacitors may be electrically connected to the circuit side of the substrate, reducing the interconnection stray inductance of each Y-capacitor. In some cases, the Y-capacitor(s) may be integrated in the module and connected between the ground connection and the DC link at the circuit side of the substrate. In other cases, a pin may be attached to a connection point for each Y-capacitor at the circuit side of the substrate, for connecting each Y-capacitor outside the power semiconductor module.

Described next, with reference to the figures, are exemplary embodiments of power semiconductor modules that utilize the Y-capacitor connection approach, related methods of production, and power electronics circuits that include the power semiconductor modules.

Figure 1A:
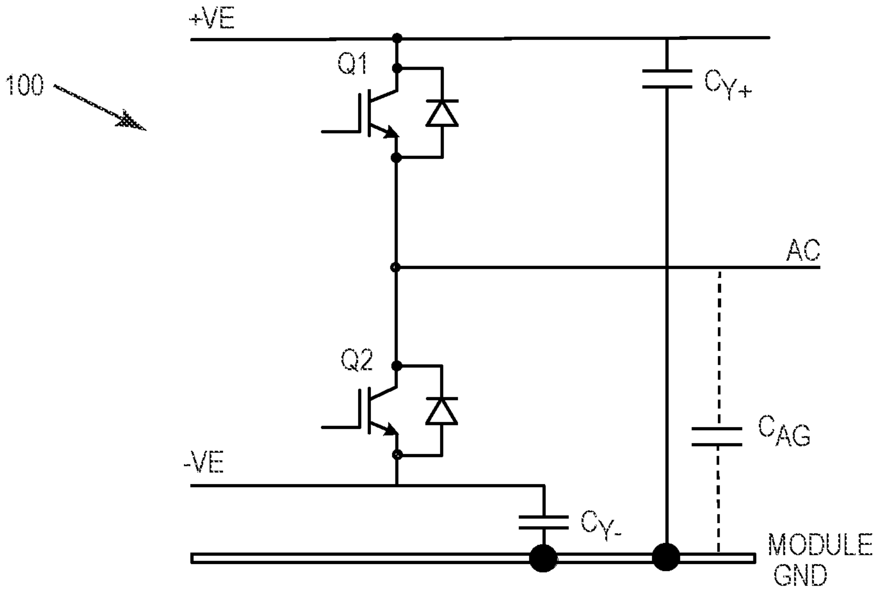
FIG. 1A illustrates a schematic diagram of a power semiconductor module for use in a power electronics circuit and having a Y-capacitor connection feature.
Figure 1B:
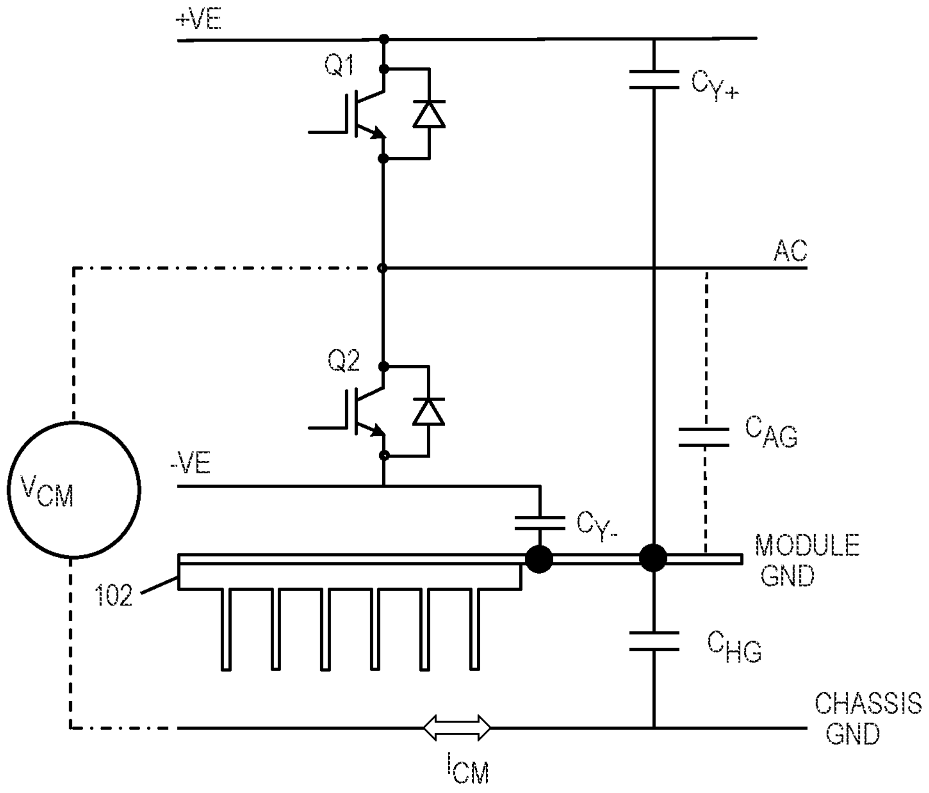
FIG. 1B illustrates a schematic diagram of the power semiconductor module mounted onto a heat sink for analysis.

FIG. 1A illustrates a schematic diagram of a power semiconductor module 100 for use in a power electronics circuit such as a DC/AC inverter, a DC/DC converter, an AC/DC rectifier, an AC/AC converter, a multi-phase inverter, an H-bridge, etc. FIG. 1B illustrates the power semiconductor module 100 mounted onto a heat sink 102 for analysis.

The power semiconductor module 100 is shown as including a half bridge formed by a high-side switch device Q1 and a low-side switch device Q2 coupled in series between a positive DC link voltage +VE and a negative DC link voltage −VE. The AC terminal 'AC' of the half bridge forms a phase of the power electronics circuit. The switch devices Q1, Q2 are illustrated as IGBTs (insulated-gate bipolar transistors) in FIG. 1, but more generally may be any type of power switch device used in power electronics circuits such as MOSFETs (metal-oxide-semiconductor field-effect transistors), HEMTs (high-electron mobility transistors), JFETs (junction field-effect transistors), etc. The power semiconductor module 100 may include a single half bridge or more than one half bridge, a full bridge, etc., depending on the type of power electronics circuit.

At least one Y-capacitor $C_Y$ is used to bypass parasitic (common mode) ground current $IC_M$. For example, a Y-capacitor $C_{Y-}$ may be connected between the negative DC link voltage −VE and module ground (GND) of each half bridge and designed to filter out common-mode noise. Another Y-capacitor $C_{Y+}$ may be connected between the positive DC link voltage +VE and module ground (GND) of each half bridge and designed to filter out common-mode noise.

In FIG. 1B, without the Y-capacitors $C_Y$, the common mode (parasitic) ground current is given by:

$$I_{CM}=V_{CM}/(Z_{AG}+Z_{HG}) \tag{1}$$

where $Z_{AG}$ is the impedance of the power module AC terminal to module ground (GND) capacitance $C_{AG}$, and $Z_{HG}$ is the impedance of the module heat sink 102 to chassis ground capacitance $C_{HG}$.

With the Y-capacitors $C_Y$, the common mode ground current becomes:

$$I_{CM}=V_{CM}*Z_{CY}/\{(Z_{AG}+Z_{CY})*(Z_{AG}//Z_{CY}+Z_{HG})\} \tag{2}$$

where $V_{CM}$ is the common mode voltage and $Z_{CY}$ is the impedance of each Y-capacitor $C_Y$. In FIG. 1B, $C_{HG}$ represents the capacitance between the power semiconductor module 100 and chassis ground, with the power semiconductor module mounted to the heat sink 102.

To minimize the common mode ground current $I_{CM}$, the Y-capacitor impedance $Z_{CY}$ should be as low as possible at the frequency range of interest. A figure of merit (FoM) defined as $Z_{CY}/Z_{AG}$ is made as low as possible by minimizing the stray inductance of Y-capacitor $C_Y$. The module AC terminal to module AC GND coupling impedance $Z_{AG}$ is purely capacitive and equal to $1/\omega C$ with $C=\varepsilon A/t$, where A is the overlapping area with capacitive coupling and ε and t are the permittivity and thickness, respectively, of the electrically insulative material 202.

As frequency increases, the stray inductance of each Y-capacitor $C_Y$ dominates the impedance $Z_{CY}$. The stray inductance of each Y-capacitor $C_Y$ is minimized using the Y-capacitor connection approach described herein by minimizing the Y-capacitor connection distance between the top (circuit) side of the module substrate and the bottom side of the substrate which is at AC ground potential, thus enhancing EMI bypass performance. Various embodiments of the Y-capacitor connection approach are described next.

Figure 2C:
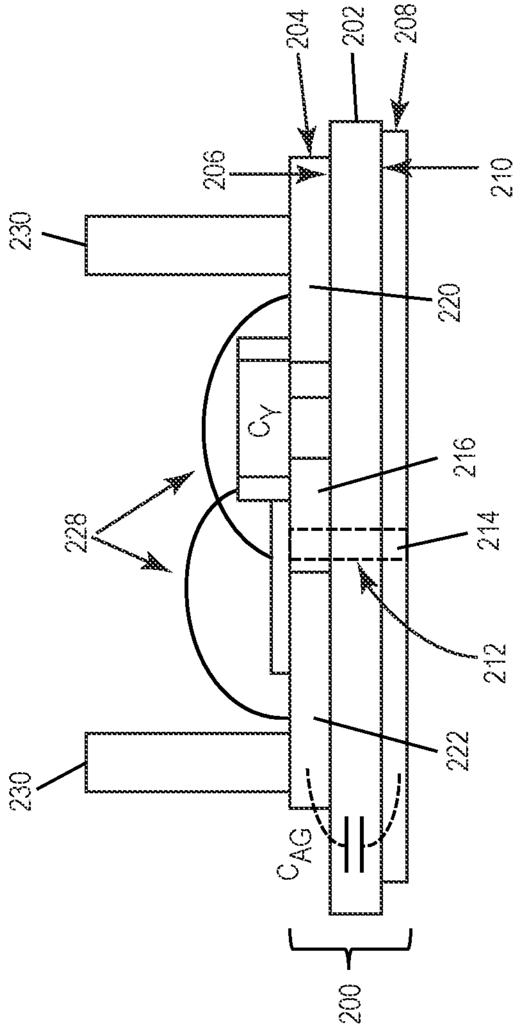
FIGS. 2A through 2C illustrate different views of the power semiconductor module, according to an embodiment.
Figure 2A:
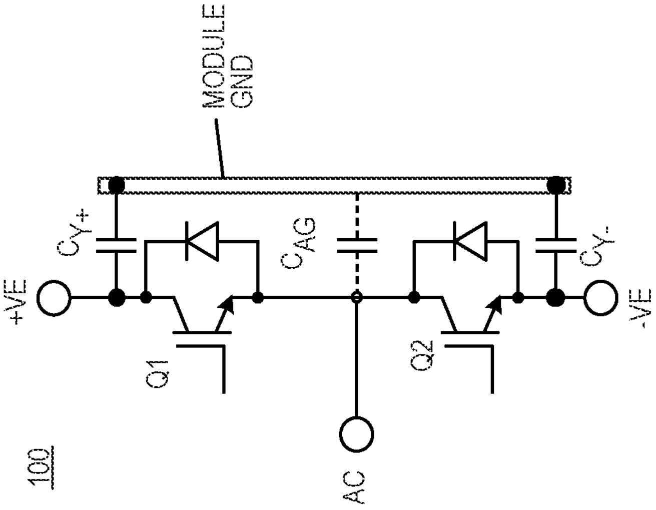
Figure 2B:
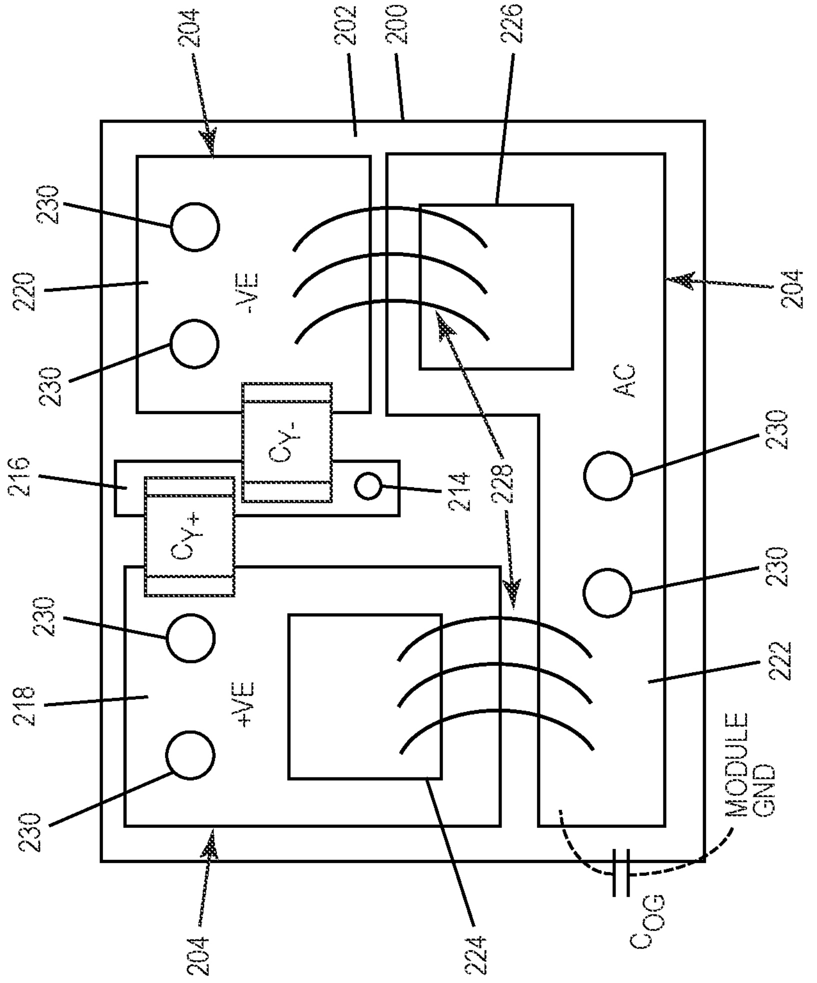

FIGS. 2A through 2C illustrate different views of the Y-capacitor connection approach, according to an embodiment. FIG. 2A shows a schematic view of the power semiconductor module 100, FIG. 2B shows a top plan view of the power semiconductor module 100, and FIG. 2C shows a side perspective view of the power semiconductor module 100.

The power semiconductor module 100 includes a substrate 200 having an electrically insulative material 202, a first metallization layer 204 at a frontside 206 of the electrically insulative material 202, and a second metallization layer 208 at a backside 210 of the electrically insulative material 202. For example, the substrate 200 may be a direct bond copper (DBC) substrate, an active metal brazed (AMB) substrate, or an insulated metal (IMS) substrate. In another example, the substrate 200 may be a laminate such as a printed circuit board (PCB).

An opening 212 in the electrically insulative material 202 of the substrate 200 exposes part of the second metallization layer 208 from the electrically insulative material 202. An electrical conductor 214 is disposed in the opening 212 and connected to the part of the second metallization layer 208 exposed by the opening 212. In FIGS. 2A through 2C, the electrical conductor 214 is connected to an island 216 of the first metallization layer 204. Multiple instances of opening 212, electrical conductor 214 and island 216 are possible.

The electrical conductor 214 may be implemented as a pin or an electrically conductive via. In the case of a pin, the electrical conductor 214 is connected to the island 216 of the first metallization layer 204 by a press-fit or soldered joint. In the case of an electrically conductive via, the electrical conductor 214 is connected to the island 216 of the first metallization layer 204 by plating and/or deposition. In either case, the electrical conductor 214 enables a point of electrical contact for the second metallization layer 208 at the frontside 206 of the electrically insulative material 202.

In FIGS. 2A through 2C, the electrical conductor 214 is implemented as an electrically conductive via that extends through the electrically insulative material 202 of the substrate 200 and connects the part of the second metallization layer 208 exposed by the opening 212 in the electrically insulative material 202 to the corresponding island 216 of the first metallization layer 204.

The first metallization layer 204 forms the circuit side of the substrate 100 whereas the second metallization layer 208 forms an AC ground plane. In the case of a half bridge device for a power electronics circuit, the first metallization layer 204 may be patterned to have an island 218 for the positive DC link voltage +VE, an island 220 for the negative DC link voltage −VE, and an island 222 for the AC terminal 'AC'. In the half bridge example, the island 216 of the first metallization layer 204 to which the electrical conductor 214 is connected is a module ground island at the circuit side of the substrate 100. The first metallization layer 204 may have additional islands, depending on the type of power electronics circuit.

The electrical conductor 214 disposed in the opening 212 in the electrically insulative material 202 of the substrate 200 enables a point of electrical contact for the second metallization layer 208 at the frontside 206 of the electrically insulative material 202. In the case of a half bridge, e.g., the second metallization layer 208 is typically at AC ground (GND) potential which means the electrical conductor 214 brings AC ground to the frontside 206 of the electrically insulative material 202, minimizing the Y-capacitor connection distance between the top (circuit) side of the module substrate 200 and the bottom side of the substrate 200, thus enhancing EMI bypass performance. Accordingly, a first Y-capacitor $C_{Y-}$ may be connected between the negative DC link voltage −VE and module ground over a very short distance that corresponds to the thickness of the substrate 200. Similarly, a second Y-capacitor $C_{Y+}$ may be connected between the positive DC link voltage +VE and module ground over the same short distance. The Y-capacitor connection approach may be implemented for each power semiconductor module 100 used to implement the power electronics circuit of interest.

The power semiconductor module 100 includes at least a first semiconductor die 224 attached to the substrate 200 or embedded in the substrate 200. The first power semiconductor die 224 forms part of the power electronics circuit that is fully or partly implemented by the power semiconductor module 100. The first power semiconductor die 224 may be attached to the first metallization layer 204 at the frontside 206 of the electrically insulative material 202 in the case of a DBC, AMB or IMS substrate, or embedded in the electrically insulative material 202 in the case of a laminate substrate.

FIGS. 2A through 2C show the substrate 200 implemented as a DBC, AMB or IMS substrate, with the first power semiconductor die 224 attached to the first metallization layer 204 at the frontside 206 of the electrically insulative material 202. In the case of a monolithically integrated chip design, the first power semiconductor die 224 may include both the high-side switch device Q1 and the low-side switch device Q2 of a half bridge, e.g., and possibly additional components such as corresponding gate drivers, etc.

In the case of discrete devices, the first power semiconductor die 224 may include the high-side switch device Q1 of the half bridge and be attached to the positive DC link voltage island 218 of the first metallization layer 204. A second power semiconductor die 226 includes the low-side switch device Q2 of the half bridge and is attached to the AC terminal island 222 of the first metallization layer 204.

The power semiconductor dies 224, 226 may be constructed with a vertical structure, in that the drain (or collector) terminal is at the backside of both dies 224, 226 and attached to the corresponding island 218, 222 of the first metallization layer 204, while the source (or emitter) terminal is at the frontside of the dies 224, 226 and electrically connected to the corresponding island 222, 204 of the first metallization layer 204 by electrical conductors 228 such as wire bonds, wire ribbons, metal clips, etc. to complete the circuit connections, e.g., such as for a half bridge. The die gate terminals and corresponding electrical connections to the first metallization layer 204 are not shown in FIGS. 2A through 2C for ease of illustration and understanding of the Y-capacitor connection approach.

In either the monolithically integrated or discrete device case, a first Y-capacitor $C_{Y-}$ may be connected between the module ground island 216 and the negative DC link voltage island 220 of the first metallization layer 204 at the circuit side of the substrate 100. A second Y-capacitor $C_{Y+}$ may be connected between the module ground island 216 and the positive DC link voltage island 218 of the first metallization layer 204 at the circuit side of the substrate 100. Pins 230 may be attached to the DC link voltage islands 218, 220 and the AC phase terminal island 222 of the first metallization layer 204, to provide points of external electrical contact for the power semiconductor module 100.

Figure 3C:
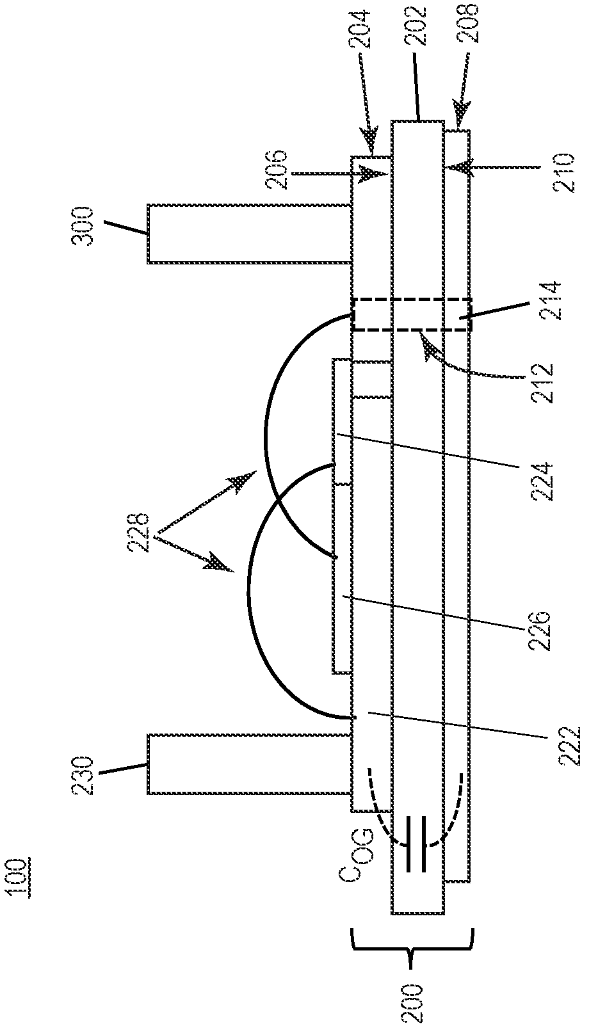
FIGS. 3A through 3C illustrate different views of the power semiconductor module, according to another embodiment.
Figure 3A:
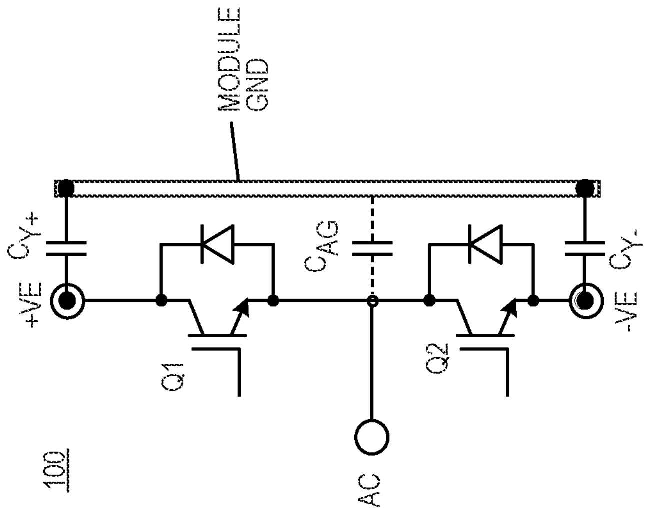
Figure 3B:
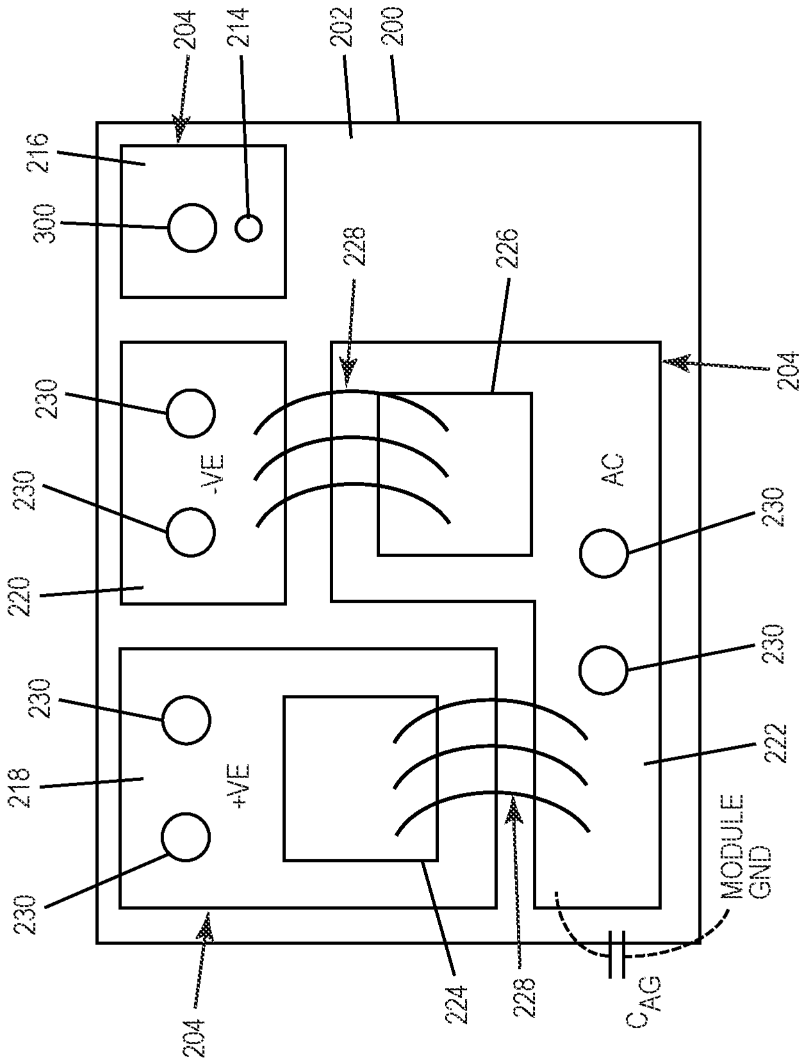

FIGS. 3A through 3C illustrate different views of the Y-capacitor connection approach, according to another embodiment. FIG. 3A shows a schematic view of the power semiconductor module 100, FIG. 3B shows a top plan view of the power semiconductor module 100, and FIG. 3C shows a side perspective view of the power semiconductor module 100.

The embodiment shown in FIGS. 3A through 3C is similar to the embodiment shown in FIGS. 2A through 2C. Differently, Y-capacitors are not included in the power semiconductor module 100. Instead, a pin 300 is attached to the module ground island 216 of the first metallization layer 204 and configured for external attachment of a Y-capacitor. More than one pin 300 may be attached to the module ground island 216 of the first metallization layer 204, and multiple instances of opening 212, electrical conductor 214 and module ground island 216 are possible, to facilitate the external connection of more than one Y-capacitor.

FIGS. 4A through 4D illustrate an embodiment of a method of producing the electrical conductor 214 that enables a point of electrical contact for the second metallization layer 208 at the frontside 206 of the electrically insulative material 202 of the substrate 200. According to this embodiment, the substrate 200 is a DBC substrate or an AMB substrate.

Figure 4A:
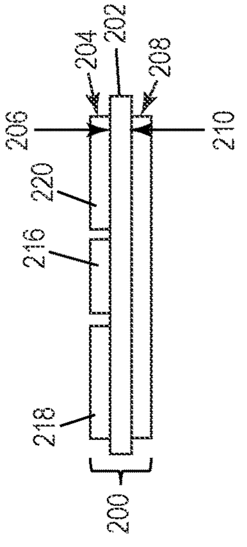
FIGS. 4A through 4D illustrate a method of producing the Y-capacitor connection feature.

FIG. 4A shows the substrate 200 before die attachment. The substrate 200 has an electrically insulative material 202, a first metallization layer 204 such as a layer of Cu, Al, etc. at the frontside 206 of the electrically insulative material 202, and a second metallization layer 208 such as a layer of Cu, Al, etc. at the backside 210 of the electrically insulative material 202.

Figure 4B:
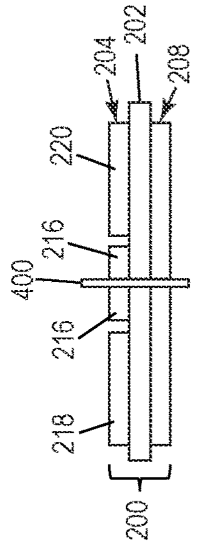

FIG. 4B shows the substrate 200 during formation of the opening 212 in the electrically insulative material 202. In one embodiment, the opening 212 in the electrically insulative material 202 is formed by laser drilling 400 a hole 402 that extends through the module ground island 216 of the first metallization layer 204, the electrically insulative material 202, and the second metallization layer 208. The laser energy and wavelength can be chosen based on the type of metal or metal alloy (e.g., Cu, Al, etc.) used for the first and second metallization layers 204, 208 and the type of material (e.g., ceramic) used for the electrically insulative material 202.

Figure 4C:
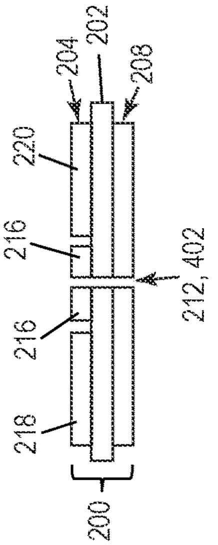

FIG. 4C shows the substrate 200 after formation of the opening 212 in the electrically insulative material 202.

Figure 4D:
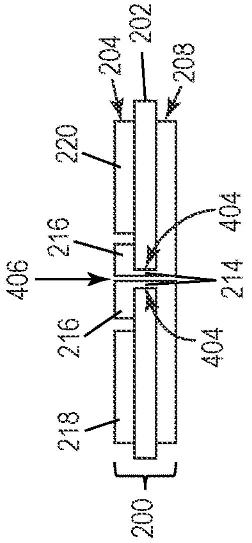

FIG. 4D shows the substrate after the electrical conductor 214 is formed in the opening 212 in the electrically insulative material 202. The electrical conductor 214 is connected to the part of the second metallization layer 208 exposed by the opening 212 in the electrically insulative material 202 and enables a point of electrical contact for the second metallization layer 208 at the frontside 206 of the electrically insulative material, as previously described herein. In one embodiment, the electrical conductor 214 is formed by depositing copper on a sidewall 404 of the hole 402 that extends through the module ground island 216 of the first metallization layer 204, the electrically insulative material 202, and the second metallization layer 208. The deposited copper may completely fill the hole 402 or a center part 406 of the hole 402 may remain unfilled.

The substrate 200 as shown in FIG. 4D may be used in the embodiment of the power module 100 shown in FIGS. 2A through 2C, by attaching one terminal of the negative Y-capacitor $C_{Y-}$ to the module ground island 216 of the first metallization layer 204 and the other terminal to the negative DC link voltage island 220 of the first metallization layer 204. One terminal of the positive Y-capacitor $C_{Y+}$ may be attached to the module ground island 216 of the first metallization layer 204 and the other terminal to the positive DC link voltage island 218 of the first metallization layer 204.

Figure 5:
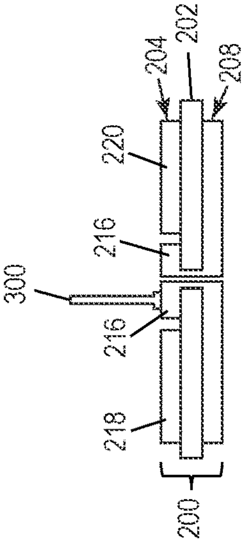
FIG. 5 illustrates another embodiment of producing the Y-capacitor connection feature.

FIG. 5 illustrates the substrate 200 of FIG. 4D, after at least one pin 300 is attached to the module ground island 216 of the first metallization layer 204. Each pin 300 is configured for external attachment of Y-capacitor $C_{Y-}$ and/or $C_{Y+}$ to the power semiconductor module 100, e.g., as shown in FIGS. 3A through 3C.

FIGS. 6A through 6D illustrate an embodiment of a method of producing the electrical conductor 214 that enables a point of electrical contact for the second metallization layer 208 at the frontside 206 of the electrically insulative material 202 of the substrate 200. According to this embodiment, the substrate 200 is an IMS substrate. For example, the second metallization layer 208 may be a metal (e.g., Al, Cu, etc.) baseplate, the electrically insulative material 202 may be a dielectric layer formed on the baseplate, and the first metallization layer 204 may be a layer of Cu formed on the dielectric layer.

Figures 6A, 6B, 6C, 6D, 7:
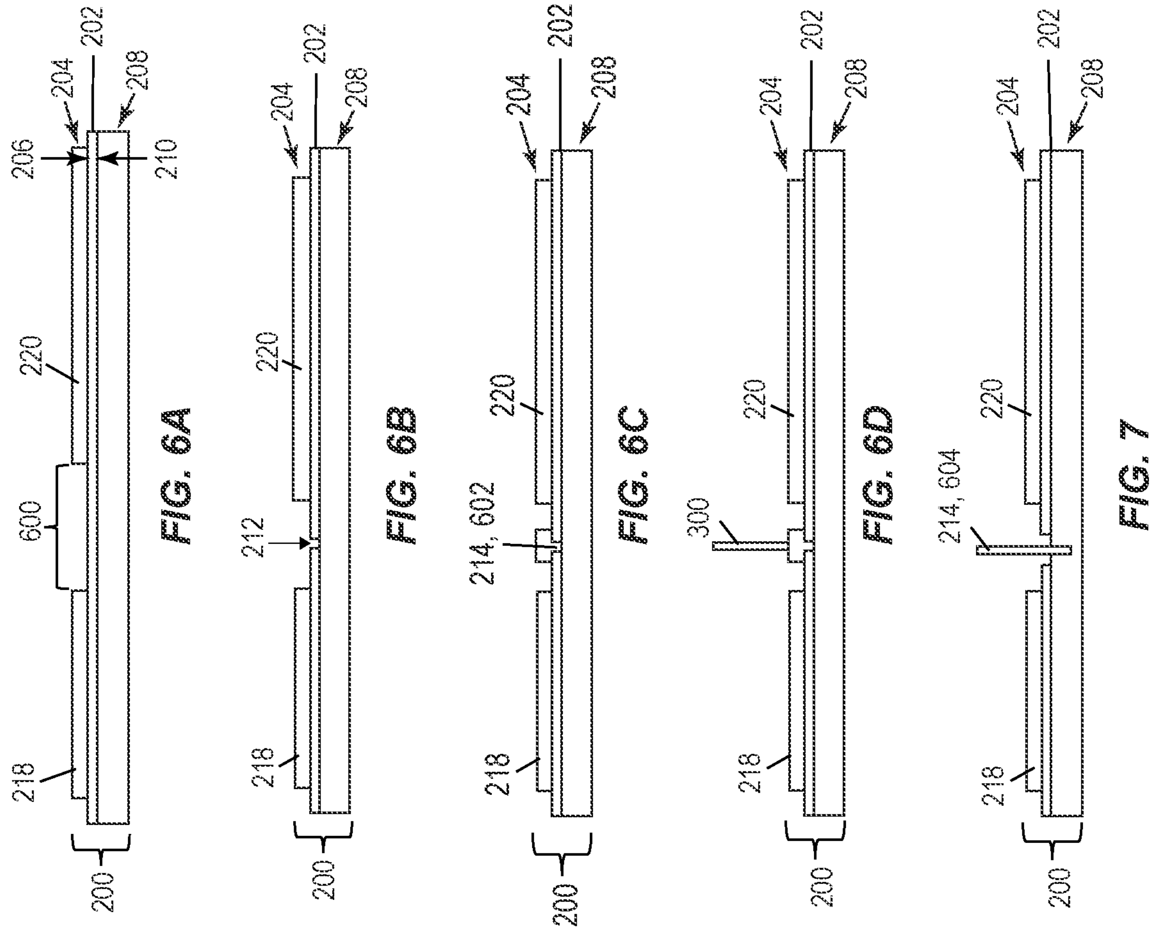
FIGS. 6A through 6D illustrate another method of producing the Y-capacitor connection feature.
FIG. 7 illustrates another embodiment of producing the Y-capacitor connection feature.

FIG. 6A shows the substrate 200 before die attachment. The module ground island 216 of the first metallization layer 204 has yet to be formed in FIG. 6A. There is a gap 600 between the positive and negative DC link voltage islands 218, 220 of the first metallization layer 204. The module ground island 216 will be formed in the gap 600, as part of the process used to form the electrical conductor 214 that provides a point of electrical connection for the second metallization layer 208 at the frontside of the substrate 200.

FIG. 6B shows the substrate 200 after forming the opening 212 in the electrically insulative material 202. The opening 212 may be formed by etching, laser drilling, etc. and is aligned with the gap 600 in the first metallization layer 204.

FIG. 6C shows the substrate 200 after the electrical conductor 214 is formed in the opening 212 in the electrically insulative material 202. In one embodiment, the electrical conductor 214 is formed by depositing copper or any other type of metal structure 602 in the opening 212 and onto the frontside 206 of the electrically insulative material 202 in a region of the gap 600 such that the deposited metal structure 602 does not contact the positive and negative DC link voltage islands 218, 220 of the first metallization layer 204. The part of the deposited metal structure 602 that extends onto the frontside 206 of the electrically insulative material 202 corresponds to the module ground island 216 shown in FIGS. 2A through 2C and FIGS. 3A through 3C.

FIG. 6D shows the substrate 200 after at least one pin 300 is attached to the part of the deposited metal structure 602 that extends onto the frontside 206 of the electrically insulative material 202. Each pin 300 faces away from the electrically insulative material 202 and is configured for external attachment of Y-capacitor $C_{Y-}$ and/or $C_{Y+}$ to the power semiconductor module 100.

FIG. 7 illustrates an alternative embodiment of producing the electrical conductor 214 that connects to the second metallization layer 208 at the backside of the substrate 200 to the module ground island 216 of the first metallization layer 204 at the circuit side of the substrate 200. According to this embodiment, at least one pin 604 penetrates the second metallization layer 208 through the opening 212 in the electrically insulative material 202 and juts out beyond the first metallization layer 204 in a region of the gap 600 such that the pin 604 does not contact the first metallization layer 204. Each pin 604 is configured for external attachment of Y-capacitor $C_{Y-}$ and/or $C_{Y+}$ to the power semiconductor module 100.

Figure 8C:
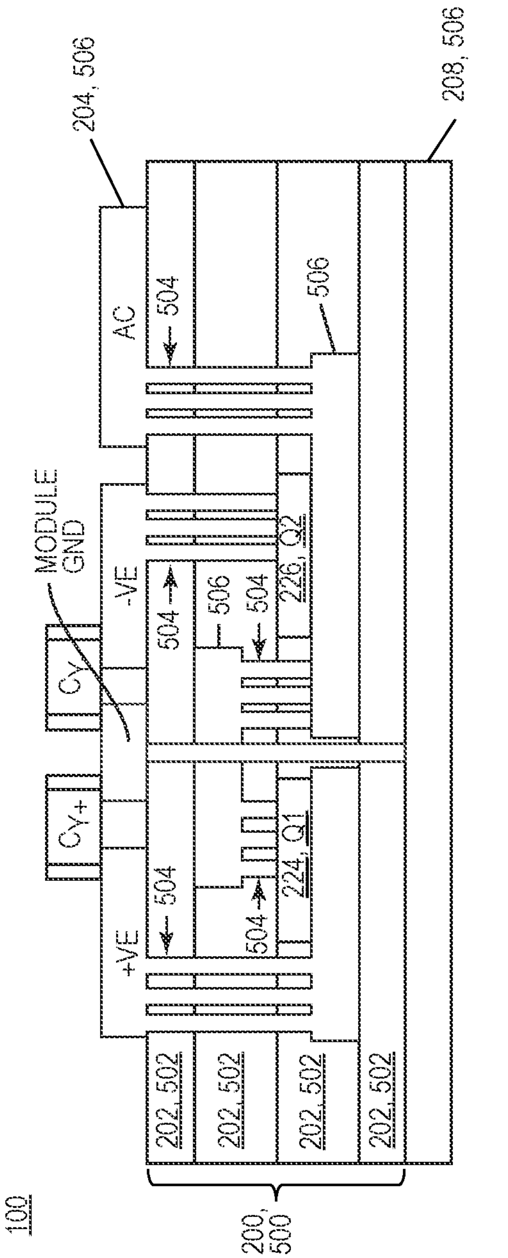
FIGS. 8A through 8C illustrate different views of the power semiconductor module, according to another embodiment.
Figure 8A:
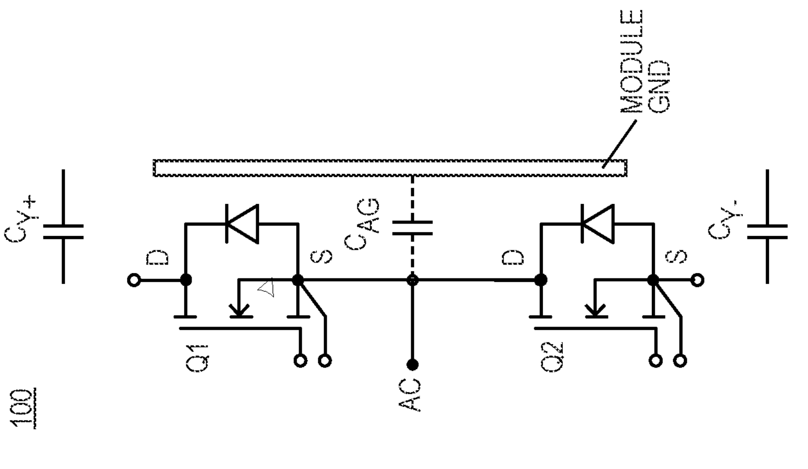
Figure 8B:
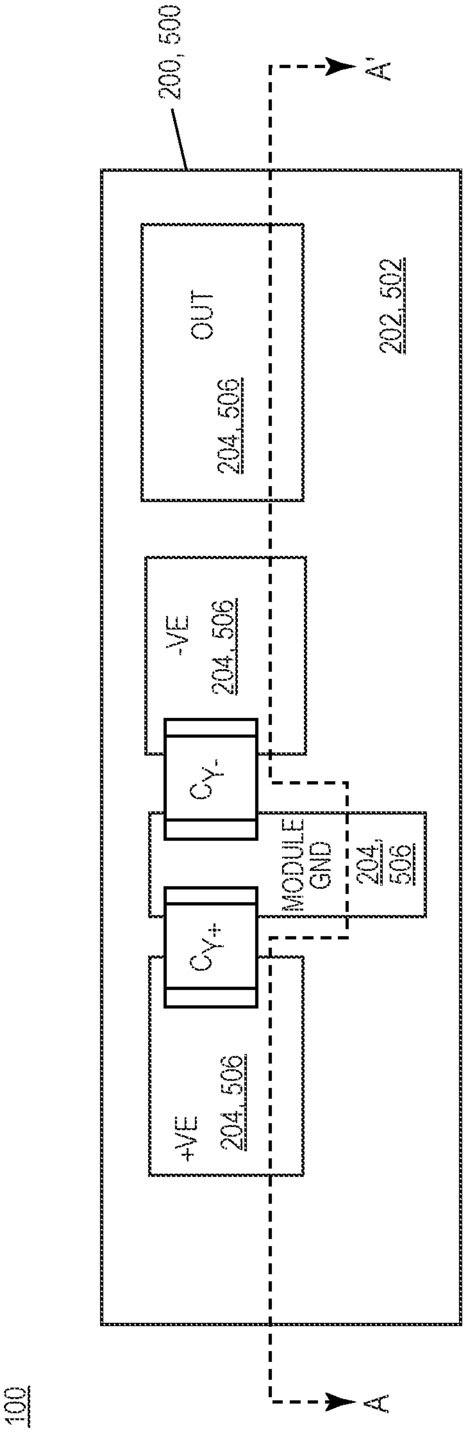

FIGS. 8A through 8C illustrate different views of the Y-capacitor connection approach, according to another embodiment. FIG. 8A shows a schematic view of the power semiconductor module 100, FIG. 8B shows a top plan view of the power semiconductor module 100, and FIG. 8C shows a cross-sectional view of the power semiconductor module 100 along the line labelled A-A' in FIG. 8B.

The high-side and low-side switch devices Q1, Q2 are shown as power MOSFETs in FIG. 8A where the drain (D) of the high-side power MOSFET Q1 is electrically connected the positive DC link voltage +VE, the source (S) of the low-side power MOSFET Q2 is electrically connected the negative DC link voltage −VE, and the source of the high-side power MOSFET Q1 and the drain of the low-side power MOSFET Q2 are electrically connected to form the AC phase terminal 'AC' of the half bridge. The high-side and low-side switch devices Q1, Q2 instead may be IGBTs, HEMTs, JFETs, etc.

In FIGS. 8A through 8C, the substrate 200 is a laminate 500 such as a PCB. The first power semiconductor die 224, which includes the high-side switch device Q1, and the second power semiconductor die 226, which includes the low-side switch device Q2, are embedded in the electrically insulative material 202 of the laminate 500. The laminate 500 is illustrated in FIG. 8C as a multi-layer PCB having multiple layers 502 of insulating material such as a glass-reinforced epoxy laminate material like FR-4. The power connection paths may be formed by electroplated vias 504 and patterned metal layers 506 deposited or laminated on the layers 502 of insulating material. Only the power connection paths are shown in the cross-sectional view of FIG. 8B.

Although the present disclosure is not so limited, the following numbered examples demonstrate one or more aspects of the disclosure.

Example 1. A power semiconductor module, comprising: a substrate comprising an electrically insulative material, a first metallization layer at a frontside of the electrically insulative material, and a second metallization layer at a backside of the electrically insulative material; a first power semiconductor die of a power electronics circuit; an opening in the electrically insulative material that exposes part of the second metallization layer from the electrically insulative material; and an electrical conductor disposed in the opening and connected to the part of the second metallization layer exposed by the opening, wherein the first power semiconductor die is attached to the first metallization layer at the frontside of the electrically insulative material, or is embedded in the electrically insulative material, wherein the electrical conductor enables a point of electrical contact for the second metallization layer at the frontside of the electrically insulative material.

Example 2. The power semiconductor module of example 1, wherein the electrical conductor comprises an electrically conductive via that extends through the electrically insulative material and connects the part of the second metallization layer exposed by the opening to a first island of the first metallization layer.

Example 3. The power semiconductor module of example 2, wherein the first power semiconductor die is attached to a second island of the first metallization layer, wherein the power electronics circuit is a power converter that includes a half bridge, wherein the first power semiconductor die forms a switch of the half bridge, wherein the second island of the first metallization layer forms a positive DC terminal or an AC terminal for the half bridge, and wherein a third island of the first metallization layer forms a negative DC terminal for the half bridge.

Example 4. The power semiconductor module of example 3, further comprising: a Y-capacitor connected between the first island and the third island of the first metallization layer.

Example 5. The power semiconductor module of example 3, further comprising: a second power semiconductor die of the power electronics circuit, the second power semiconductor die attached to a fourth island of the first metallization layer, wherein the first power semiconductor die forms a high-side switch of the half bridge, wherein the second power semiconductor die forms a low-side switch of the half bridge, wherein the second island of the first metallization layer forms the positive DC terminal for the half bridge, wherein the fourth island of the first metallization layer forms the AC terminal for the half bridge.

Example 6. The power semiconductor module of example 5, further comprising: a first Y-capacitor connected between the first island and the third island of the first metallization layer.

Example 7. The power semiconductor module of example 6, further comprising: a second Y-capacitor connected between the first island and the second island of the first metallization layer.

Example 8. The power semiconductor module of example 2, further comprising: a Y-capacitor connected between the first island of the first metallization layer and a second island of the first metallization layer, wherein the second island of the first metallization layer is at a different potential than the first island.

Example 9. The power semiconductor module of example 2, further comprising: a pin attached to the first island of the first metallization layer, wherein the pin is configured for external attachment of one or more Y-capacitors.

Example 10. The power semiconductor module of any of examples 1 through 9, wherein the opening in the electrically insulative material is aligned with a gap in the first metallization layer, and wherein the electrical conductor comprises a metal structure that fills the opening in the electrically insulative material and extends onto the frontside of the electrically insulative material in a region of the gap such that the metal structure does not contact the first metallization layer.

Example 11. The power semiconductor module of example 10, further comprising: a pin attached to a side of the metal structure that faces away from the electrically insulative material, wherein the pin is configured for external attachment of one or more Y-capacitors.

Example 12. The power semiconductor module of example 10, further comprising: a Y-capacitor connected between the metal structure and an island of the first metallization layer, wherein the metal structure is at a different potential than the island of the first metallization layer.

Example 13. The power semiconductor module of any of examples 1 through 9, wherein the opening in the electrically insulative material is aligned with a gap in the first metallization layer, and wherein the electrical conductor comprises a pin that penetrates the second metallization layer through the opening in the electrically insulative material and juts out beyond the first metallization layer in a region of the gap such that the pin does not contact the first metallization layer, and wherein the pin is configured for external attachment of one or more Y-capacitors.

Example 14. The power semiconductor module of any of examples 1 through 13, wherein the substrate is a direct bond copper (DBC) substrate, an active metal brazed (AMB) substrate, or an insulated metal (IMS) substrate, and wherein the first power semiconductor die is attached to the first metallization layer at the frontside of the electrically insulative material.

Example 15. The power semiconductor module of any of examples 1 through 13, wherein the substrate is a laminate, and wherein the first power semiconductor is embedded in the electrically insulative material of the laminate.

Example 16. A power semiconductor module, comprising: a substrate comprising an electrically insulative material, a first metallization layer at a frontside of the electrically insulative material, and a second metallization layer at a backside of the electrically insulative material; a first power semiconductor die of a half bridge; a second power semiconductor die of the half bridge; an opening in the electrically insulative material that exposes part of the second metallization layer from the electrically insulative material; and an electrical conductor disposed in the opening and connected to the part of the second metallization layer exposed by the opening, wherein the electrical conductor comprises an electrically conductive via that extends through the electrically insulative material and connects the part of the second metallization layer exposed by the opening to a first island of the first metallization layer, wherein the first power semiconductor die is attached to a second island of the first metallization layer that forms a positive DC terminal for the half bridge, wherein a third island of the first metallization layer forms a negative DC terminal for the half bridge, wherein the second power semiconductor die is attached to a fourth island of the first metallization layer that forms the AC terminal for the half bridge.

Example 17. The power semiconductor module of example 16, further comprising: a first Y-capacitor connected between the first island and the third island of the first metallization layer.

Example 18. The power semiconductor module of example 17 or 18, further comprising: a second Y-capacitor connected between the first island and the second island of the first metallization layer.

Example 19. A method of producing a power semiconductor module, the method comprising: providing a substrate comprising an electrically insulative material, a first metallization layer at a frontside of the electrically insulative material, and a second metallization layer at a backside of the electrically insulative material; attaching a first power semiconductor die of a power electronics circuit to the first metallization layer at the frontside of the electrically insulative material, or embedding the first power semiconductor die in the electrically insulative material; forming an opening in the electrically insulative material that exposes part of the second metallization layer from the electrically insulative material; and forming an electrical conductor in the opening and that is connected to the part of the second metallization layer exposed by the opening, the electrical conductor enabling a point of electrical contact for the second metallization layer at the frontside of the electrically insulative material.

Example 20. The method of example 19, wherein forming the opening in the electrically insulative material comprises laser drilling a hole that extends through a first island of the first metallization layer, the electrically insulative material, and the second metallization layer, and wherein forming the electrical conductor comprises depositing copper on a sidewall of the hole.

Example 21. The method of example 20, further comprising: attaching a pin to the first island of the first metallization layer, wherein the pin is configured for external attachment of one or more Y-capacitors.

Example 22. The method of any of examples 19 through 21, wherein the opening in the electrically insulative material is aligned with a gap in the first metallization layer, and wherein forming the electrical conductor comprises depositing copper in the opening and onto the frontside of the electrically insulative material in a region of the gap such that the deposited copper does not contact the first metallization layer.

Example 23. The method of example 22, further comprising: attaching a pin to a side of the deposited copper that faces away from the electrically insulative material, wherein the pin is configured for external attachment of a Y-capacitor.

As used herein, the terms "having," "containing," "including," "comprising," and the like are open-ended terms that indicate the presence of stated elements or features, but do not preclude additional elements or features. The articles "a," "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module, comprising:

a substrate comprising an electrically insulative material, a first metallization layer at a frontside of the electrically insulative material, and a second metallization layer at a backside of the electrically insulative material;

a first power semiconductor die of a power electronics circuit;

an opening in the electrically insulative material that exposes part of the second metallization layer from the electrically insulative material; and an electrical conductor disposed in the opening and connected to the part of the second metallization layer exposed by the opening, wherein the first power semiconductor die is attached to the first metallization layer at the frontside of the electrically insulative material, or is embedded in the electrically insulative material, wherein the electrical conductor enables a point of electrical contact for the second metallization layer at the frontside of the electrically insulative material.

2. The power semiconductor module of claim 1, wherein the electrical conductor comprises an electrically conductive via that extends through the electrically insulative material and connects the part of the second metallization layer exposed by the opening to a first island of the first metallization layer.

3. The power semiconductor module of claim 2, wherein the first power semiconductor die is attached to a second island of the first metallization layer, wherein the power electronics circuit is a power converter that includes a half bridge, wherein the first power semiconductor die forms a switch of the half bridge, wherein the second island of the first metallization layer forms a positive DC terminal or an AC terminal for the half bridge, and wherein a third island of the first metallization layer forms a negative DC terminal for the half bridge.

4. The power semiconductor module of claim 3, further comprising:

a Y-capacitor connected between the first island and the third island of the first metallization layer.

5. The power semiconductor module of claim 3, further comprising:

a second power semiconductor die of the power electronics circuit, the second power semiconductor die attached to a fourth island of the first metallization layer, wherein the first power semiconductor die forms a high-side switch of the half bridge, wherein the second power semiconductor die forms a low-side switch of the half bridge, wherein the second island of the first metallization layer forms the positive DC terminal for the half bridge, wherein the fourth island of the first metallization layer forms the AC terminal for the half bridge.

6. The power semiconductor module of claim 5, further comprising:

a first Y-capacitor connected between the first island and the third island of the first metallization layer.

7. The power semiconductor module of claim 6, further comprising:

a second Y-capacitor connected between the first island and the second island of the first metallization layer.

8. The power semiconductor module of claim 2, further comprising:

a Y-capacitor connected between the first island of the first metallization layer and a second island of the first metallization layer, wherein the second island of the first metallization layer is at a different potential than the first island.

9. The power semiconductor module of claim 2, further comprising:

a pin attached to the first island of the first metallization layer, wherein the pin is configured for external attachment of one or more Y-capacitors.

10. The power semiconductor module of claim 1, wherein the opening in the electrically insulative material is aligned with a gap in the first metallization layer, and wherein the electrical conductor comprises a metal structure that fills the opening in the electrically insulative material and extends onto the frontside of the electrically insulative material in a region of the gap such that the metal structure does not contact the first metallization layer.

11. The power semiconductor module of claim 10, further comprising:

a pin attached to a side of the metal structure that faces away from the electrically insulative material, wherein the pin is configured for external attachment of one or more Y-capacitors.

12. The power semiconductor module of claim 10, further comprising:

a Y-capacitor connected between the metal structure and an island of the first metallization layer, wherein the metal structure is at a different potential than the island of the first metallization layer.

13. The power semiconductor module of claim 1, wherein the opening in the electrically insulative material is aligned with a gap in the first metallization layer, and wherein the electrical conductor comprises a pin that penetrates the second metallization layer through the opening in the electrically insulative material and juts out beyond the first metallization layer in a region of the gap such that the pin does not contact the first metallization layer, and wherein the pin is configured for external attachment of one or more Y-capacitors.

14. The power semiconductor module of claim 1, wherein the substrate is a direct bond copper (DBC) substrate, an active metal brazed (AMB) substrate, or an insulated metal (IMS) substrate, and wherein the first power semiconductor die is attached to the first metallization layer at the frontside of the electrically insulative material.

15. The power semiconductor module of claim 1, wherein the substrate is a laminate, and wherein the first power semiconductor is embedded in the electrically insulative material of the laminate.

16. A power semiconductor module, comprising:

a substrate comprising an electrically insulative material, a first metallization layer at a frontside of the electrically insulative material, and a second metallization layer at a backside of the electrically insulative material;

a first power semiconductor die of a half bridge;

a second power semiconductor die of the half bridge;

an opening in the electrically insulative material that exposes part of the second metallization layer from the electrically insulative material; and an electrical conductor disposed in the opening and connected to the part of the second metallization layer exposed by the opening, wherein the electrical conductor comprises an electrically conductive via that extends through the electrically insulative material and connects the part of the second metallization layer exposed by the opening to a first island of the first metallization layer, wherein the first power semiconductor die is attached to a second island of the first metallization layer that forms a positive DC terminal for the half bridge, wherein a third island of the first metallization layer forms a negative DC terminal for the half bridge, wherein the second power semiconductor die is attached to a fourth island of the first metallization layer that forms the AC terminal for the half bridge.

17. The power semiconductor module of claim 16, further comprising:

a first Y-capacitor connected between the first island and the third island of the first metallization layer.

18. The power semiconductor module of claim 17, further comprising:

a second Y-capacitor connected between the first island and the second island of the first metallization layer.

19. A method of producing a power semiconductor module, the method comprising:

providing a substrate comprising an electrically insulative material, a first metallization layer at a frontside of the electrically insulative material, and a second metallization layer at a backside of the electrically insulative material;

attaching a first power semiconductor die of a power electronics circuit to the first metallization layer at the frontside of the electrically insulative material, or embedding the first power semiconductor die in the electrically insulative material;

forming an opening in the electrically insulative material that exposes part of the second metallization layer from the electrically insulative material; and forming an electrical conductor in the opening and that is connected to the part of the second metallization layer exposed by the opening, the electrical conductor enabling a point of electrical contact for the second metallization layer at the frontside of the electrically insulative material.

20. The method of claim 19, wherein forming the opening in the electrically insulative material comprises laser drilling a hole that extends through a first island of the first metallization layer, the electrically insulative material, and the second metallization layer, and wherein forming the electrical conductor comprises depositing copper on a sidewall of the hole.

21. The method of claim 20, further comprising:

attaching a pin to the first island of the first metallization layer, wherein the pin is configured for external attachment of one or more Y-capacitors.

22. The method of claim 19, wherein the opening in the electrically insulative material is aligned with a gap in the first metallization layer, and wherein forming the electrical conductor comprises depositing copper in the opening and onto the frontside of the electrically insulative material in a region of the gap such that the deposited copper does not contact the first metallization layer.

23. The method of claim 22, further comprising:

attaching a pin to a side of the deposited copper that faces away from the electrically insulative material, wherein the pin is configured for external attachment of one or more Y-capacitors.

* * * * *